(12) United States Patent
Caird (10) Patent No.: US 8,326,554 B2
(45) Date of Patent: Dec. 4, 2012

(54) SYSTEMS, METHODS, AND APPARATUS FOR UTILITY METER PHASE IDENTIFICATION

(75) Inventor: Kenneth James Caird, Smyrna, GA (US)

(73) Assignee: General Electric Company, Schenectady, NY (US)

( * ) Notice: Subject to any disclaimer, the term of this patent is extended or adjusted under 35 U.S.C. 154(b) by 386 days.

(21) Appl. No.: 12/650,989

(22) Filed: Dec. 31, 2009

(65) Prior Publication Data

US 2011/0161022 A1    Jun. 30, 2011

(51) Int. Cl.
*G01R 21/00* (2006.01)
(52) U.S. Cl. .......................................................... 702/62
(58) Field of Classification Search .................... 702/62, 702/67, 182–185, 188
See application file for complete search history.

(56) References Cited

U.S. PATENT DOCUMENTS

| | | | |
|---|---|---|---|
| 5,510,700 A | 4/1996 | Pomatto | |
| 7,372,246 B2 | 5/2008 | Marsden et al. | |
| 2004/0263147 A1 | 12/2004 | Piesinger | |
| 2007/0296396 A1 | 12/2007 | Nakahira | |
| 2008/0116877 A1 | 5/2008 | Giubbini et al. | |
| 2009/0213828 A1 | 8/2009 | Brundage et al. | |
| 2009/0233621 A1 | 9/2009 | Rhoads et al. | |
| 2010/0060259 A1 | 3/2010 | Vaswani et al. | |
| 2010/0134089 A1 | 6/2010 | Uram et al. | |
| 2010/0324845 A1 * | 12/2010 | Spanier et al. | 702/62 |

OTHER PUBLICATIONS

Disclosure Statement under 37 C.F.R. § 1.56.

* cited by examiner

*Primary Examiner* — Edward Raymond
(74) *Attorney, Agent, or Firm* — Sutherland Asbill & Brennan LLP (57) ABSTRACT

Systems, methods, and apparatus for utility meter phase identification are provided. A utility meter may receive, from a remote system, a plurality of reference signals for respective zero crossings for a plurality of phases in a multiple-phase power system. The reference signals may be generated utilizing a precision time source. The utility meter may also receive a precision time signal from a time source. The precision time signal may be utilized to time stamp a zero crossing of a voltage signal at the meter, and the time stamped voltage signal may be compared to the plurality of reference signals in order to determine a phase to which the utility meter is connected.

20 Claims, 4 Drawing Sheets

SYSTEMS, METHODS, AND APPARATUS FOR UTILITY METER PHASE IDENTIFICATION

FIELD OF THE INVENTION

Embodiments of the invention relate generally to utility meters, and more specifically to systems, methods, and apparatus for identifying a phase to which a utility meter is connected.

BACKGROUND OF THE INVENTION

Utility meters, such as electrical meters, are typically utilized at residences and businesses to monitor the provision of one or more utility services. Recently, a wide variety of different types of smart meters and advanced meters have been developed to facilitate the collection of additional consumption data and to facilitate various network communications between the meters and other entities, such as a local utility. Smart meters are utilized for a wide variety of purposes, including billing purposes, outage detection, voltage level detection, volt-ampere reactive loss detection, detection of aggregated load on transformers, and submetering of appliance usage.

In electrical power systems, smart meters are typically connected to a single phase within a three-phase electrical power system. In order to utilize data received from a smart meter for various business purposes, the phase to which the meter is connected must often be determined or identified. If the phase utilized in business calculations is incorrect, the results of the calculations may often be incorrect. However, during the installation of meters, the meters are often incorrectly installed or connected on the wrong phase. Additionally, repair crews and repair technicians often disconnect meters during repair and/or maintenance and then reconnect meters to the wrong phase. Further, during overload conditions, a dispatcher may switch a circuit to another substation for load balancing purposes, thereby resulting in certain meters being connected to a different phase. Over time, the business application that utilize meter data often cannot accurately determine or identify which phase various meters are connected to and which phase received meter data is associated with.

Accordingly, a need exists for improved systems, methods, and apparatus for identifying a phase to which a utility meter is connected.

BRIEF DESCRIPTION OF THE INVENTION

Some or all of the above needs and/or problems may be addressed by certain embodiments of the invention. Embodiments of the invention may include systems, methods, and apparatus for identifying a phase to which a utility meter is connected. According to one embodiment of the invention, there is disclosed a method for utility meter phase identification. A plurality of reference signals for respective zero crossings for a plurality of phases in a multiple-phase power system may be received at a utility meter from a remote system via a network. The plurality of reference signals may be generated utilizing a precision time source. A precision time signal may also be received at the utility meter from a time source via the network. A zero crossing of a voltage signal of the utility meter may be time stamped utilizing the received precision time signal. The time stamped voltage signal may be compared to the plurality of received reference signals. Based at least in part on the comparison, a phase to which the utility meter is connected may be determined.

According to another embodiment of the invention, there is disclosed system or apparatus, such as a utility meter. The utility meter may include a network interface and at least one processing device, such as a suitable computing device. The network interface may be configured to receive, via a network, (i) a precision time signal from a time source and (ii) a plurality of reference signals for respective zero crossings for a plurality of phases in a multiple-phase power system, wherein the plurality of reference signals are generated by a remote system utilizing a precision time source. The at least one processing device may be configured to (i) time stamp a zero crossing of a voltage signal of the utility meter utilizing the received precision time signal, (ii) compare the time stamped voltage signal to the plurality of received reference signals, and (iii) determine, based at least in part on the comparison, a phase to which the utility meter is connected.

Additional systems, methods, apparatus, features, and aspects are realized through the techniques of various embodiments of the invention. Other embodiments and aspects of the invention are described in detail herein and are considered a part of the claimed invention. Other embodiments and aspects can be understood with reference to the description and the drawings.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

Illustrative embodiments of the invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like numbers refer to like elements throughout.

Disclosed are systems and methods for utility meter phase identification. A plurality of reference signals for respective zero crossings for a plurality of phases in a multiple-phase or multi-phase power system may be received at a utility meter from a remote system, such as a power substation system, via a network. The plurality of reference signals may be generated by the remote system utilizing a precision time source, such as a global positioning system (GPS) precision time source. Additionally, a precision time signal may be received at the utility meter from a time source via the network. The precision time signal may be dynamically updated at the utility meter via communications between the utility meter and the time source. In this regard, a relatively accurate time signal may be maintained at the utility meter. For example, a precision time signal may be generated at the time source utilizing a GPS precision time source or other suitable precision time source, and the generated time signal may be communicated to the utility meter. The time source may then utilize communications between the utility meter and the time source, such as pings, to determine a correction factor for the time signal that is utilized at the utility meter. The correction factor may then be communicated to the utility meter and utilized to update or adjust the time signal at the meter.

In order to identify a phase to which the utility meter is connected, a zero crossing of a voltage signal connected to the utility meter may be time stamped utilizing the received and/or updated precision time signal. The time stamped voltage signal may then be compared to any number of the plurality of received reference signals. Based at least in part on the comparison, a phase to which the utility meter is connected may be determined.

Various embodiments of the invention may include one or more special purpose computers, systems, and/or particular machines that facilitate utility meter phase identification. A special purpose computer or particular machine may include a wide variety of different software modules as desired in various embodiments. As explained in greater detail below, in certain embodiments, these various software components may be utilized to dynamically determine which phase a utility meter, such as a power meter, is connected to within a power system.

Certain embodiments of the invention described herein may have the technical effect of identifying a phase to which a utility meter is connected. For example, the phase to which a smart power meter is connected within a multi-phase power system may be identified. In this regard, various business calculations and/or data analyses that utilize a phase identification may be performed in a relatively accurate manner. Certain embodiments of the invention may further have the technical effect of dynamically determining or identifying a phase to which a utility meter is connected.

Figure 1:
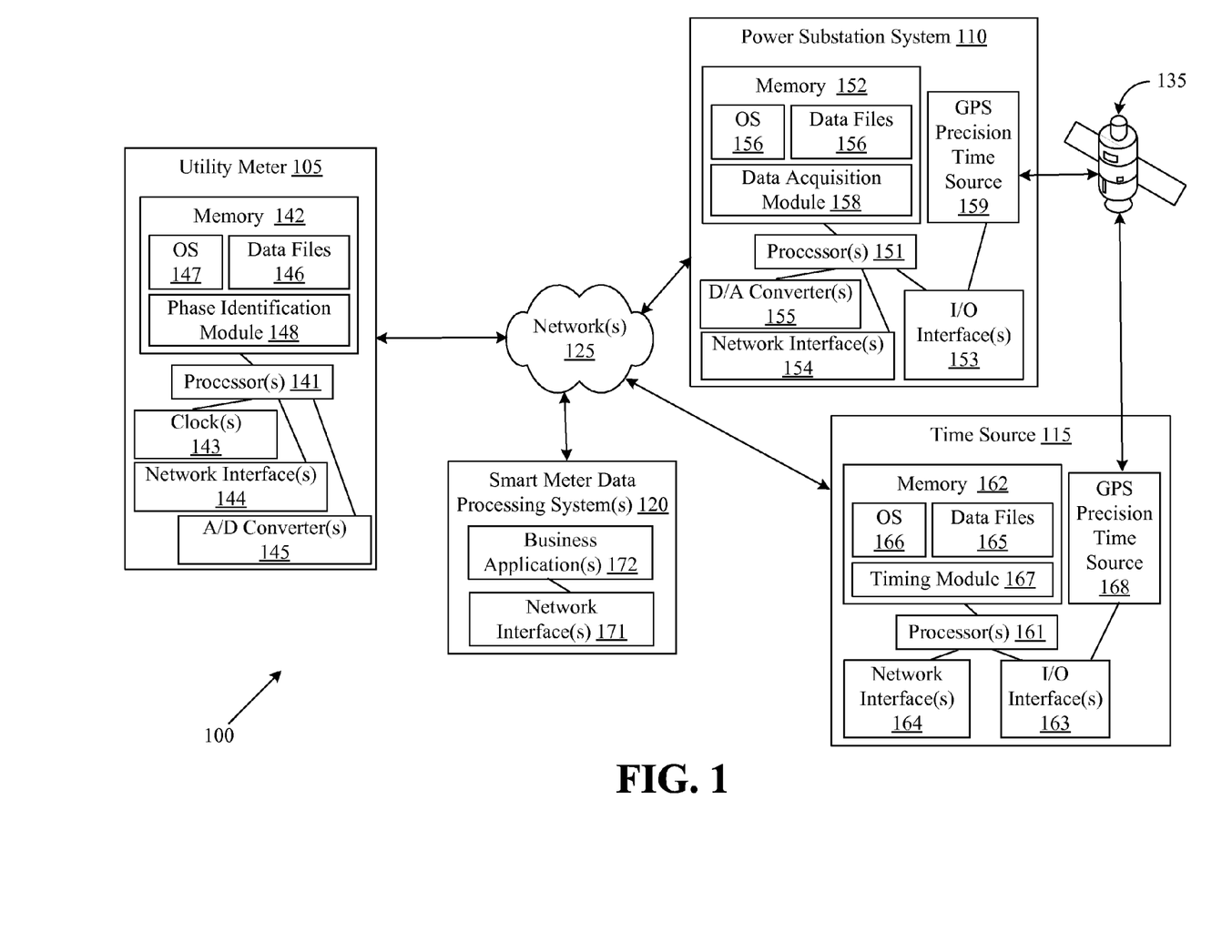
FIG. 1 is a block diagram of one example system that facilitates utility meter phase identification, according to an illustrative embodiment of the invention.

FIG. 1 is a block diagram of one example system 100 for identifying a phase to which a utility meter is connected, according to an illustrative embodiment of the invention. The system 100 illustrated in FIG. 1 may include a utility meter 105, a power substation system 110, and a time source 115.

The utility meter 105 may be any suitable utility meter that may be connected to at least one phase of a multiple-phase power system. For example, the utility meter 105 may be a suitable electrical meter or power meter that is connected to a phase within a multiple-phase power system, such as a three-phase electrical power system. As such, the utility meter 105 may be configured to measure an amount of electrical energy (e.g., kilowatt hours, etc.) or electrical power that is supplied to an associated residence, business, or machine.

Figure 2:
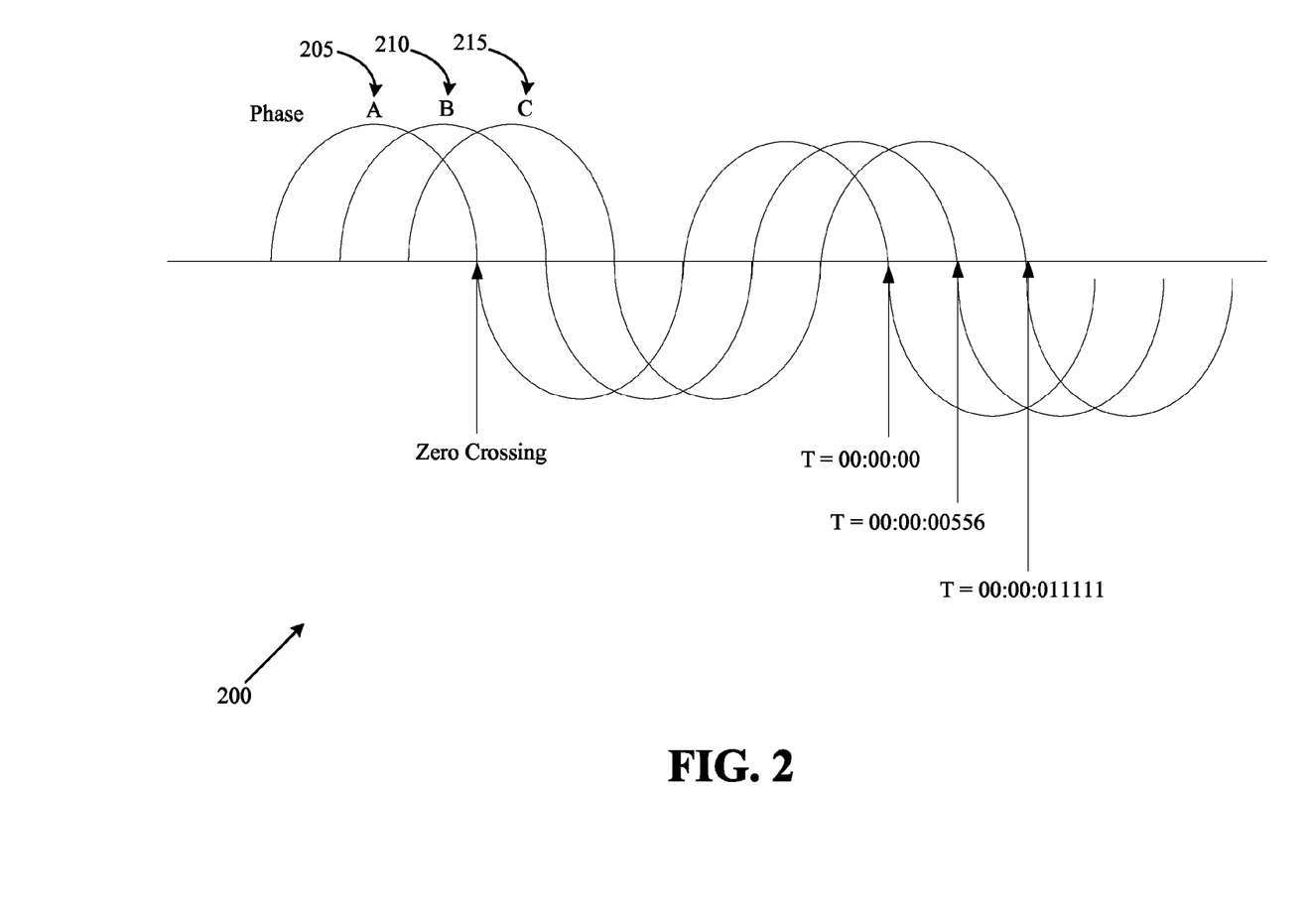
FIG. 2 is a diagram of example voltage signals for a three phase power system that may be utilized in accordance with various embodiments of the invention.

In an example three-phase system, three circuit conductors may be configured to carry three alternating currents (of approximately the same frequency) which reach their instantaneous peak values at different times. The voltage signal on each conductor of a three-phase system may be separated vectorially from each other by approximately 180 degrees. In other words, each phase may be delayed from the other phases by approximately one-third of a cycle. An example 200 of the phases within a three-phase power system is illustrated in FIG. 2. With reference to FIG. 2, three voltage signals 205, 210, 215 are illustrated, and the three voltage signals 205, 210, 215 may respectively correspond to a first phase (phase A), a second phase (phase B), and a third phase (phase C). The second signal 210 may be delayed in time by approximately one-third of a cycle from the first signal 205, and the third signal 215 may be delayed in time by approximately two-thirds of a cycle from the first signal 205. Accordingly, the zero crossings of the second signal 210 and the third signal 215 may be respectively delayed in time from a zero crossing of the first signal 205 by approximately one-third and approximately two-thirds of a cycle. Given a relatively constant frequency of approximately sixty Hertz (60 Hz), a zero crossing of the first signal 205 may be time stamped or clocked at a time that is set as a reference to time zero (0). A zero crossing of the second signal 210 may then time stamped at approximately 5.556 milliseconds or at approximately one third of a cycle later. Similarly, a zero crossing of the third signal 215 may be time stamped at approximately 11.111 milliseconds or at approximately two thirds of a cycle later. As desired, the signals and/or measurements illustrated in FIG. 2 may be utilized as reference signals that may be communicated to a utility meter for phase determination purposes, such as the utility meter 105 illustrated in FIG. 1. Additionally, in certain embodiments, other frequencies may be utilized in a three-phase power system, such as a frequency of 50 Hz.

With continued reference to FIG. 1, in certain embodiments, the utility meter 105 may be a smart meter or an advanced meter that is configured to identify consumption in relatively greater detail than a conventional meter. For example, a smart utility meter 105 may facilitate real-time or near real-time readings, power outage notification, and/or power quality monitoring. Additionally, as desired, a smart utility meter 105 may communicate measurements data, calculations, and/or other information to one or more recipients, such as a local utility or smart meter data processing system 120 via one or more suitable networks 125. The communicated data and/or information may then be utilized for various monitoring and/or billing purposes. Smart meter data may be utilized for a wide variety of purposes as desired in various embodiments of the invention, including but not limited to, billing purposes, variable pricing purposes, load shifting purposes, power outage detection, voltage level detection, volt-ampere reactive (VAR) loss detection, the determination of the aggregated load on one or more transformers, and/or submetering of appliance usage within a residence or business.

The utility meter 105 may include any number of suitable computer processing components that facilitate the determination of a phase to which the utility meter is connected. For example, the utility meter 105 may include one or more controllers or processing devices that are configured to obtain and/or maintain a precision time signal, to obtain a plurality of reference signals, and to utilize the precision time signal and the reference signals to identify or determine a phase to which the utility meter 105 is connected. Examples of suitable processing devices that may be incorporated into a utility meter 105 include, but are not limited to application specific circuits, microcontrollers, minicomputers, other computing devices, and the like. As such the utility meter 105 may include any number of processors 141 that facilitate the execution of computer-readable instructions to control the operations of the utility meter 105 and/or the determination of a phase to which the utility meter 105 is connected. By executing computer-readable instructions associated with phase determination, the utility meter 105 may include or form a special purpose computer that facilitates a determination of a phase connection.

In addition to one or more processor(s) 141, the utility meter 105 may include one or more memory devices 142, one or more clocks 143, one or more network interfaces 144, and/or one or more analog-to-digital (A/D) converters 145.

The one or more memory devices 142 or memories may be any suitable memory devices for example, caches, read only memory devices, random access memory devices, magnetic storage devices, etc. The one or more memory devices 142 may store data, executable instructions, and/or various program modules utilized by the utility meter 105, for example, data files 146, an operating system 147, and/or a phase identification module 148 or phase identification application. The data files 146 may include stored data associated with the operation of the utility meter 105, stored data associated with measurements and/or readings taken by the utility meter 105, stored data associated with calculations made by the utility meter 105, stored data associated with a precision time signal and/or corrections for the precision time signal, and/or stored data associated with one or more reference signals.

In certain embodiments of the invention, the utility meter 105 may include any number of software applications that are executed to facilitate the operations of the utility meter 105. The software applications may include computer-readable instructions that are executable by the one or more processors 141. The execution of the computer-readable instructions may form a special purpose computer that facilitates the operations of the utility meter 105 as well as the determination or identification of a phase to which the utility meter 105 is connected. As an example of a software application, the utility meter 105 may optionally include an operating system ("OS") 147 that controls the general operation of the utility meter 105 and that facilitates the execution of additional software applications. Additionally, the utility meter 105 may include a phase identification module 148 that is operable to identify or determine a phase to which the utility meter 105 is connected.

In an example embodiment, the phase identification module 148 may receive a precision time signal from a remote entity, such as the time source 115, and the phase identification module 148 may maintain the precision time signal. For example, a precision time signal may be received via one or more suitable networks 125, such as the Internet and/or an advanced metering infrastructure (AMI) network. The received precision time signal may be an analog or a digital signal. As desired, if an analog signal is received, the signal may be processed by the A/D converter(s) 145 and/or any number of digital filters in order to obtain a digital signal. In certain embodiments, the phase identification module 148 may update or adjust the precision time signal based upon one or more correction factors that are received from the time source 115 and/or other remote entities. For example, a time source 115 may communicate ping signals to the utility meter 105, and the time source 115 may utilizes responses to the various pings to calculate or determine a network delay between the time source 115 and the utility meter 105. A correction factor that accounts for the network delay may then be communicated to the utility meter 105, and the phase identification module 148 may utilize the correction factor to adjust or update the precision time signal. The precision time signal may be continually updated in order to reduce error and/or differences between the precision time signal and a time signal that is maintained by the time source 115. In this regard, the precision time signal may be continually adjusted in real-time or near-real time, thereby leading to a relatively accurate precision time signal.

The phase identification module 148 may utilize the precision time signal to time stamp or clock a zero crossing of the voltage signal or power signal to which the utility meter 105 is connected. As desired, the time stamped voltage signal may be converted into digital data by the A/D converter(s) 145 and/or any number of digital filters. The time stamped voltage signal may then be compared by the phase identification module 148 to a plurality of reference signals that have been received by the utility meter 105 from a remote entity, such as the power substation system 110. For example, the power substation system 110 may time stamp zero crossings for each of the three phases within a three-phase system, and the power substation system 110 may generate three reference signals based at least in part on the time stamping. The reference signals may then be communicated to the utility meter 105 via one or more suitable networks 125. If the reference signals are received as analog signals, in certain embodiments, the reference signals may be processed by the A/D converter(s) 145 and/or any number of digital filters in order to obtain digital reference signals. The reference signals may then be compared to the time stamped voltage signal in order to determine which phase the utility meter 105 is connected to.

For example, a period of the time stamped voltage signal may be compared to the periods of each of the reference signals, and a determination may be made as to which reference signal the period most resembles. As another example, one or more of the received reference signals may be time stamped by the meter and time stamps for the reference signals may be compared to a time stamp of the voltage signal in order to determine which phase the meter is connected to. In certain embodiments, the received reference signals may be time delayed as a result of transport of the reference signals to the utility meter 105 via the network 125. In these embodiments, the reference signals may be incremented any number of times by a predetermined value in order to facilitate comparisons until a match or approximate match is identified. For example, the period of each cycle in a 60 Hz. power system may have a duration of approximately 16.6667 milliseconds. Accordingly, each reference signal may be incremented by this approximate duration until a match or approximate match is found between a reference signal and a time stamped voltage signal generated by the utility meter 105. A wide variety of other suitable comparisons and/or determinations may be utilized as desired in other embodiments of the invention. Additionally, either analog or digital comparisons may be made as desired in various embodiments of the invention.

In certain embodiments, the phase identification module 148 may dynamically identify or determine which phase a meter is connected to in real-time, near real-time, and/or at predetermined or periodic intervals, such as once an hour or once a day. Additionally, as desired, the utility meter 105 may communicate any number of messages and/or communications indicating a phase to which the meter 105 is connected to any number of other components of the system 100, such as the power substation system 110 and/or to one or more smart meter data processing systems 120.

With continued reference to the utility meter 105, the one or more clocks 143 may include digital and/or analog clocks that facilitate timing within the utility meter 105 and/or clocking of various components of the utility meter 105. A wide variety of different types of clocks and/or clock generators may be utilized as desired in various embodiments of the invention, for example, quartz piezo-electric oscillators, other resonant circuits, and/or other suitable clock generators. Additionally, a wide variety of different clock signals may be utilized, such as a square wave clock signal.

The one or more network interfaces 144 may facilitate connection of the utility meter 105 to the one or more suitable networks 125. In this regard, the utility meter 105 may receive data from and/or communicate data to other components of the system. For example, a precision time signal and/or correction factor(s) may be received from the time source 115 and reference signals may be received from the power substation system 110. As another example, a phase identification may be communicated to the power substation system 110 and/or the smart meter data processing systems 120.

The power substation system 110 may be a suitable system that is associated with a local utility, such as a power substation that is operable to provide power to a power grid to which the utility meter 105 is connected. In certain embodiments of the invention, the power substation system 110 may be configured to generate reference signals for each phase included within a multiple phase power system and to provide the generate reference signals to any number of utility meters. The power substation system 110 may include suitable any number of suitable computer processing components that facilitate the generation and/or communication of reference signals. For example, the power substation system 110 may include one or more controllers or processing devices that are configured to generate and/or communicate reference signals. Examples of suitable processing devices that may be incorporated into a power substation include, but are not limited to application specific circuits, microcontrollers, minicomputers, personal computers, servers, other computing devices, and the like. As such the power substation system 110 may include any number of processors 151 that facilitate the execution of computer-readable instructions to control the operations of the power substation system 110 and/or the generation of reference signals. By executing computer-readable instructions, the power substation system 110 may include or form a special purpose computer that facilitates the generation and/or communication of reference signals that may be further processed by a recipient utility meter.

In addition to one or more processor(s) 151 the power substation system 110 may include one or more memory devices 152, one or more I/O interfaces 153, one or more network interfaces 154, and/or one or more digital-to-analog (D/A) converters 155. The one or more memory devices 152 or memories may be any suitable memory devices for example, caches, read only memory devices, random access memory devices, magnetic storage devices, etc. The one or more memory devices 152 may store data, executable instructions, and/or various program modules utilized by the power substation system 110, for example, data files 156, an operating system 157, and/or a data acquisition module 158 or data acquisition application. The data files 156 may include stored data associated with the operation of the power substation and/or the power substation system 110, stored data associated with generated reference signals, and/or data received from one or more utility meters.

The power substation system 110 may include any number of software applications that are executed to facilitate the operations of the power substation system 110. The software applications may include computer-readable instructions that are executable by the one or more processors 151. The execution of the computer-readable instructions may form a special purpose computer that facilitates the generation and/or communication of reference signals. As an example of a software application, the power substation system 110 may include an operating system ("OS") 157 that controls the general operation of the power substation system 110 and that facilitates the execution of additional software applications. Additionally, the power substation system 110 may include a data acquisition module 158 that is operable to time stamp voltage signals for the phases connected to the power substation and generate reference signals for those phases for communication to one or more utility meters.

The power substation system 110 may additional include a precision time source 159, such as a GPS time source that is operable to communicate with one or more GPS satellites 135 in order to generate a precision time signal that may be utilized by the power substation system 110. As desired, an output from the precision time source 159 may be received by the data acquisition module 158 via the I/O interfaces 153. The precision time signal may then be utilized by the data acquisition module 158 to time stamp the phases or phase signals that are connected to the power station in order to generate reference signals for communication to the utility meter 105. An example of the generation of reference signals will now be discussed in greater detail with reference to FIG. 3.

Figure 3:
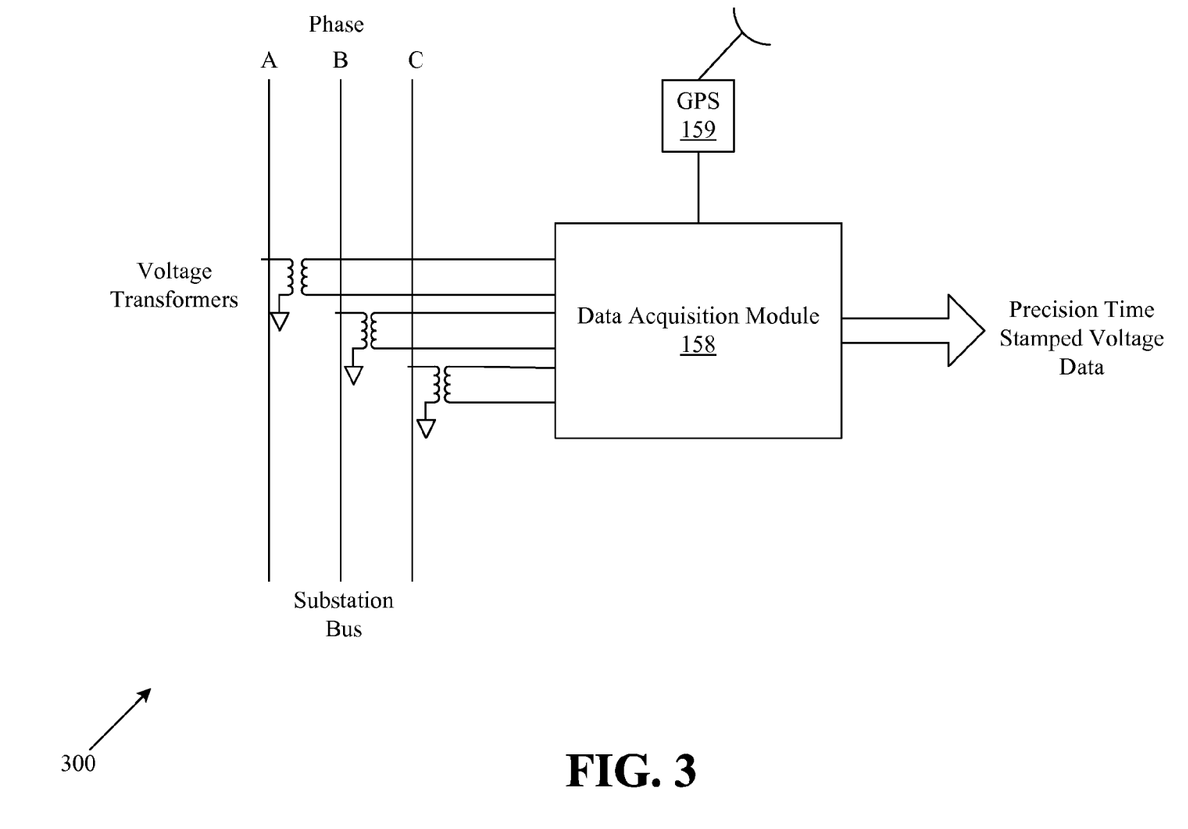
FIG. 3 is a schematic diagram of an example utility substation that may generate reference signals for a multi-phase power system, accordance to an illustrative embodiment of the invention.

FIG. 3 illustrates example components of a power substation that may be utilized to generate reference signals. A precision time source 159 may be utilized to generate or obtain a precision time signal that is provided to a data acquisition module 158. The precision time signal may then be utilized to time stamp the zero crossings for voltage signals for each of the phases that are connected to the power substation. For example, the zero crossing of each of the voltage phases in a substation bus may be time stamped. In certain embodiments, the time for a zero crossing of a first phase may then be set to a reference value, such as zero (0), and the times for the zero crossings of the remaining phases may then be determined or adjusted. Once the reference signals have been generated, the reference signals may be communicated to any number of utility meters via one or more suitable networks 125, such as an AMI network. In this regard, the reference signals may be utilized by the meters for phase identifications. The reference signals may be communicated as either digital signals or analog signals. As desired, one or more suitable D/A converters, such as the D/A converters 155 illustrated in FIG. 1, may be utilized to convert digital signals to analog signals for communication to the utility meters. Additionally, reference signals may be communicated to meters via power line carrier communications in certain embodiments of the invention.

With continued reference to the power substation system 110, the one or more I/O interfaces 154 may facilitate the receipt of data by a processing component of the power substation system 110 from one or more other components, such as the precision time source 159 and/or from one or more users. Additionally, the one or more network interfaces 155 may facilitate connection of the power substation system 110 to the one or more suitable networks 125. In this regard, the power substation system 110 may receive data from and/or communicate data to other components of the system 100, such as the utility meter 105.

The time source 115 may be a suitable network device or system that is operable to or configured to provide a precision time signal to one or more utility meters. The time source 115 may include suitable any number of suitable computer processing components that facilitate the generation and/or communication of a precision time signal. For example, the time source 115 may include one or more controllers or processing devices that are configured to generate and/or communicate a precision time signal. Examples of suitable processing devices that may be incorporated into a time source 115 include, but are not limited to application specific circuits, microcontrollers, minicomputers, personal computers, servers, other computing devices, and the like. As such the time source 115 may include any number of processors 161 that facilitate the execution of computer-readable instructions to control the operations of the time source 115. By executing computer-readable instructions, the time source 115 may include or form a special purpose computer that facilitates the generation and/or communication of a precision time signal, as well as the update and/or adjustment of the precision time signal.

In addition to one or more processor(s) 161 the time source 115 may include one or more memory devices 162, one or more I/O interfaces 163, and one or more network interfaces 164. The one or more memory devices 162 or memories may be any suitable memory devices for example, caches, read only memory devices, random access memory devices, magnetic storage devices, etc. The one or more memory devices 162 may store data, executable instructions, and/or various program modules utilized by the time source 115, for example, data files 165, an operating system 166, and/or a timing module 167 or timing application. The data files 165 may include stored data associated with the operation of the time source 115, stored data associated with a generated precision time signal, stored data associated with pings and/or other messages communicated between the time source 115 and one or more utility meters, precision time signal correction factors or update data, and/or other data received from one or more utility meters.

The time source 115 may include any number of software applications that are executed to facilitate the operations of the time source 115. The software applications may include computer-readable instructions that are executable by the one or more processors 161. The execution of the computer-readable instructions may form a special purpose computer that facilitates the generation, communication, and/or update of one or more precision time signals. As an example of a software application, the time source 115 may include an operating system ("OS") 166 that controls the general operation of the time source 115 and that facilitates the execution of additional software applications. Additionally, the time source 115 may include a timing module 167 that is operable to receive, generate, and/or update a precision time signal.

Similar to the power substation system 110, the time source 115 may include a precision time source 168, such as a GPS time source that is operable to communicate with one or more GPS satellites 135 in order to generate a precision time signal. As desired, an output from the precision time source 168 may be received by the data timing module 167 via the I/O interfaces 163. The timing module 167 may direct the communication of the precision time signal to one or more utility meters, such as the utility meter 105 described above.

The precision time signal that is received by each meter may have an error that is proportional to the network delay from the time source 115 to the meter. In certain embodiments of the invention, the timing module 167 may determine a network delay between the time source 115 and the utility meter 105, and the timing module 167 may generate a correction factor for the precision time signal that takes the network delay and/or other delays into consideration. For example, the timing module 167 may direct the communication of a ping signal or other communication to the utility meter 105, and the meter 105 may communicate a reply to the time source 105 that includes the reading or value of the precision time signal at the meter 105. The timing module 167 may compare the received value to the value of the GPS time signal at the time source 115. Based at least in part on the comparison, the timing module 167 may generate a time error correction factor for the utility meter 105 based upon the clock differences between the meter clock and the time source clock and/or the network delays. The time error correction factor may then be communicated to the utility meter 105 and utilized by the meter 105 to update its clock and/or precision time signal. The ping process may be repeated as desired until an error between the meter clock and the time source clock is less than a desired threshold, such as plus or minus one (1) millisecond. Additionally, corrections may be made in real-time, near real-time, or on a periodic basis. For example, a ping may be communicated to the meter 105 approximately every five minutes in order to verify and/or update the meter clock or meter precision time signal. In this regard, a relatively accurate precision time signal may be maintained at the utility meter 105.

With continued reference to the time source 115, the one or more I/O interfaces 163 may facilitate the receipt of data by a processing component of the time source 115 from one or more other components, such as the precision time source 168 and/or from one or more users. Additionally, the one or more network interfaces 164 may facilitate connection of the time source 115 to the one or more suitable networks 125. In this regard, the time source 115 may receive data from and/or communicate data to other components of the system 100, such as the utility meter 105.

As desired, the system 100 may include any number of smart meter data processing systems 120. A smart meter data processing system 120 may be operable to receive a wide variety of data from utility meters, such as usage data and/or phase identification data. In this regard, the smart meter data processing system 120 may perform various business calculations and/or usage calculations on the data. Similar to other components of the system 100, a smart meter data processing system 120 may be a suitable processor driven that includes any number of processors and/or memory devices. Additionally, the smart meter data processing system 120 may include one or more network interfaces 171 that are operable to receive data from any number of utility meters via one or more suitable networks 125. The smart meter data processing system 120 may also include any number of business applications 172 or business modules that may be executed by the one or more processors to analyze the received data. According to an aspect of the invention, the smart meter data processing system 120 may utilize received data to ascertain or determine which phase each meter is connected to. Accordingly, the analysis and/or calculations performed by the smart meter data processing system 120 may be relatively accurate.

The one or more networks 125 may include any number of suitable networks that facilitate communications between the utility meter 105 and/or other components of the system 100, such as the power substation system 110, the time source 115, and/or the smart meter data processing system 120. One example of a suitable network is a AMI network although other networks may be utilized as desired, for example, a wide area network, the Internet, a cellular network, a radio frequency network, a Bluetooth™ enabled network (trademark owned by BLUETOOTH SIG, INC.), a satellite-based network, any wired network, any wireless network, etc. Additionally, as desired, multiple networks may be utilized. For example, a wide area network may be utilized to facilitate communications between the time source 115 and an intermediary or intervening router or other component that may then route communications to a utility meter 105 via an AMI network.

As desired, embodiments of the invention may include a system 100 with more or less than the components illustrated in FIG. 1. Additionally, certain components of the system 100 may be combined in various embodiments of the invention. For example, the time source 115 and/or any number of smart meter data processing systems 120 may be incorporated into the power substation system 110. The system 100 of FIG. 1 is provided by way of example only.

Figure 4:
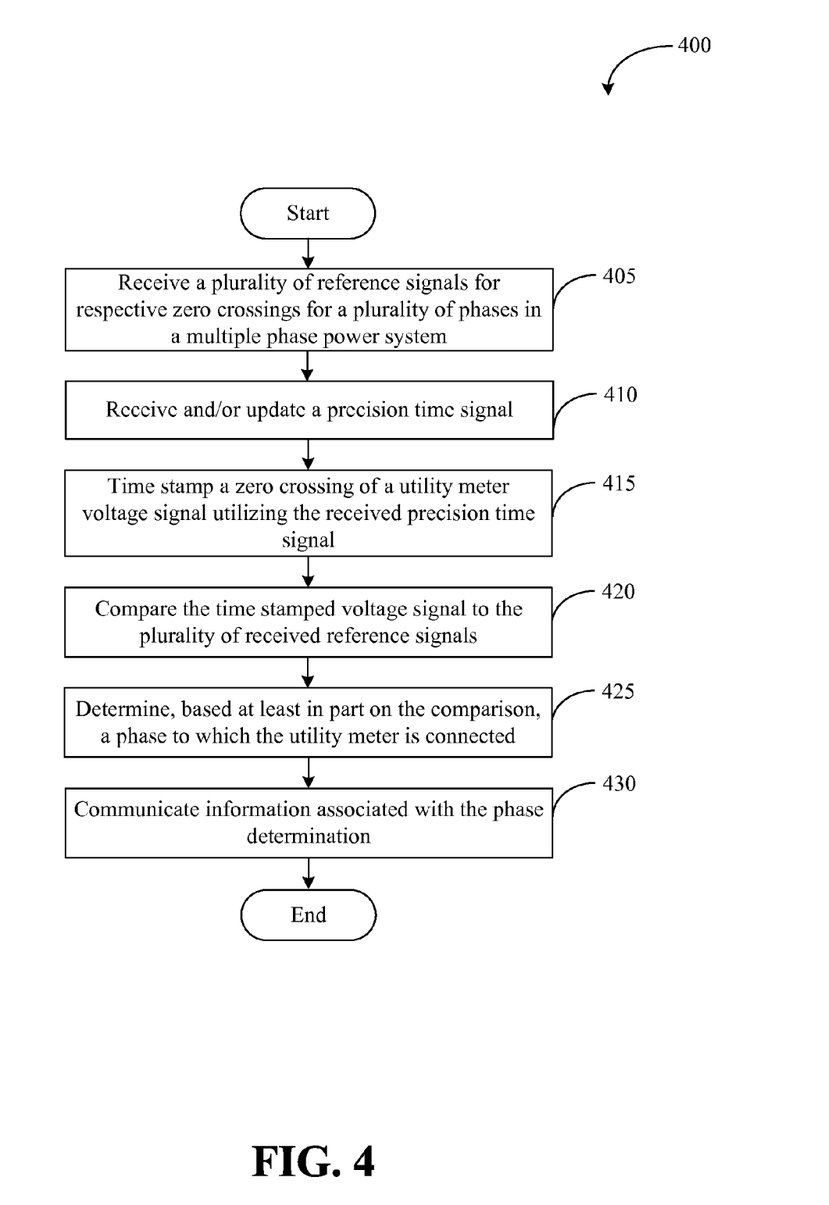
FIG. 4 is a flowchart of an example method for identifying a phase to which a utility meter is connected, according to an illustrative embodiment of the invention.

FIG. 4 is a flowchart illustrating one example method 400 for identifying a phase to which a utility meter is connected, according to an illustrative embodiment of the invention. The method may be utilized in association with one or more utility meter phase identification systems, such as the system 100 illustrated in FIG. 1. In certain embodiments, the method 400 may be performed by a suitable processing device or computing device incorporated into and/or in communication with a utility meter, such as the utility meter 105 illustrated in FIG. 1, to dynamically determine a phase to which the meter 105 is connected.

The method 400 may begin at block 405. At block 405, a plurality of reference signals for respective zero crossings of a plurality of phases in a multiple-phase power system may be received. For example, in a three-phase power system, three respective reference signals for the three phases may be received. The reference signals may be received from a suitable remote device or system, such as the power substation system 110 illustrated in FIG. 1. Additionally, the reference signals may be received via one or more suitable networks, such as an AMI network. As desired, the reference signals may be stored for subsequent access and/or use. Alternatively, the reference signals may be utilized upon receipt for a phase identification.

At block 410, a precision time signal, such as a time signal that was generated utilizing a precision time source (e.g., a GPS time source) may be received. The precision time signal may be received from a suitable remote device or system, such as the time source 115 illustrated in FIG. 1. Additionally, the precision time signal may be received via one or more suitable networks, such as the AMI network and/or any intervening networks between the AMI network and the time source 115. The received precision time signal may be utilized to set a clock situated at the utility meter 105.

Additionally, in certain embodiments, the precision time signal may be updated or adjusted at the utility meter 105 based at least in part on correction factors that are received from the time source 115. For example, a ping signal may be received at the utility meter 105 from the time source 115, and a response to the ping signal that includes the current value or reading of the precision time signal may be communicated to the time source 115 by the utility meter 105. The time source 115 may utilize the response to calculate a correction factor that takes the network delay between the time source 115 and the utility meter 105 into consideration, and the calculated or generated correction factor may be communicated to the utility meter 105. The utility meter 105 may utilize the received correction factor to update, adjust, or revise the precision time signal. The process of pinging a utility meter 105 may be repeated any number of times and/or on a periodic basis in order to enhance and/or maintain the accuracy of the precision time signal that is utilized by the meter 105.

At block 415, the precision time signal may be utilized to time stamp or clock a zero crossing of the voltage signal or power signal that is connected to the utility meter 105. The time stamped voltage signal may then be compared to any number of the received reference signals at block 420. At block 425, a determination may be made, based at least in part on the one or more comparisons, as to which phase in a multiple-phase power system that the utility meter 105 is connected to. Example comparisons and/or determinations are discussed in greater detail above with reference to FIG. 1.

At block 430, information associated with the phase identification or phase determination may be communicated to one or remote components, such as the power substation system 110 and/or the smart meter data processing systems 120 illustrated in FIG. 1. For example, a message included an identifier of the phase to which the utility meter 105 is connected may be generated by the utility meter 105 and communicated to one or more recipients via any number of suitable networks, such as an AMI network and/or any number of other networks.

The method 400 may end following block 430.

The operations described and shown in the method 400 of FIG. 4 may be carried out or performed in any suitable order as desired in various embodiments of the invention. Additionally, in certain embodiments, at least a portion of the operations may be carried out in parallel. Furthermore, in certain embodiments, less than or more than the operations described in FIG. 4 may be performed. As desired, the operations set forth in the method 400 may be performed in a periodic manner, such as once an hour, once a day, etc.

The invention is described above with reference to block and flow diagrams of systems, methods, apparatuses, and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general purpose computer, a special-purpose computer, a processor, or other programmable data processing apparatus to produce a particular machine, such that the instructions that execute on the computer, processor, or other programmable data processing apparatus create means for implementing one or more functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer usable medium having a computer readable program code or program instructions embodied therein, said computer readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special purpose hardware and computer instructions.

While the invention has been described in connection with what is presently considered to be the most practical and various embodiments, it is to be understood that the invention is not to be limited to the disclosed embodiments, but on the contrary, is intended to cover various modifications and equivalent arrangements included within the spirit and scope of the appended claims.

This written description uses examples to disclose the invention, including the best mode, and also to enable any person skilled in the art to practice the invention, including making and using any devices or systems and performing any incorporated methods. The patentable scope the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The claimed invention is:

1. A method for utility meter phase identification, the method comprising:
   receiving, at a utility meter from a remote system via a network, a plurality of reference signals for respective zero crossings for a plurality of phases in a multiple-phase power system, wherein the plurality of reference signals is generated utilizing a precision time source;
   receiving, at the utility meter from a time source and via the network, a precision time signal;
   time stamping a zero crossing of a voltage signal of the utility meter utilizing the received precision time signal;
   comparing the time stamped voltage signal to the plurality of received reference signals;
   determining, based at least in part on the comparison, a phase to which the utility meter is connected; and
   storing data associated with the phase determination at the utility meter.

2. The method of claim 1, wherein receiving a plurality of reference signals from a remote system comprises receiving a plurality of reference signals from a power substation.

3. The method of claim 1, wherein receiving a plurality of reference signals that are generated utilizing a precision time source comprises receiving a plurality a reference signals that are generated utilizing a global positioning system precision time source.

4. The method of claim 1, wherein receiving a plurality of reference signals and a precision time signal comprises receiving the plurality of reference signals and the precision time signal via an advanced metering infrastructure network.

5. The method of claim 1, wherein receiving a plurality of reference signals for respective zero crossings for a plurality of phases in a multiple-phase power system comprises receiving a plurality of reference signals for a three phase power system.

6. The method of claim 1, wherein receiving a precision time signal comprises receiving a precision time signal that is generated utilizing a global positioning system precision time source.

7. The method of claim 1, further comprising:
   receiving, from the time source via the network, a correction factor for the precision time signal; and
   adjusting the precision time signal based at least in part on the received correction factor.

8. The method of claim 7, further comprising:
   receiving, from the time source via the network, a network ping; and
   communicating, to the time source via the network, a response to the network ping that includes a value of the precision time signal,
   wherein the response is utilized by the time source to calculate the correction factor.

9. The method of claim 1, further comprising:
   communicating, via the network, information associated with the phase determination.

10. The method of claim 9, wherein communicating information associated with the phase determination comprises communicating information to a data processing system.

11. A utility meter, comprising:
    network interface configured to receive, via a network, (i) a precision time signal from a time source and (ii) a plurality of reference signals for respective zero crossings for a plurality of phases in a multiple-phase power system, wherein the plurality of reference signals is generated by a remote system utilizing a precision time source; and
    at least one processing device configured to (i) time stamp a zero crossing of a voltage signal of the utility meter utilizing the received precision time signal, (ii) compare the time stamped voltage signal to the plurality of received reference signals, and (iii) determine, based at least in part on the comparison, a phase to which the utility meter is connected.

12. The utility meter of claim 11, wherein the plurality of reference signals is received from a power substation.

13. The utility meter of claim 11, wherein the plurality of reference signals is generated utilizing a global positioning system precision time source.

14. The utility meter of claim 11, wherein the network comprises an advanced metering infrastructure network.

15. The utility meter of claim 11, wherein the multiple-phase power system comprises a three phase power system.

16. The utility meter of claim 11, wherein the received precision time signal comprises a signal that is generated utilizing a global positioning system precision time source.

17. The utility meter of claim 11, wherein:
    the network interface is further configured to receive, from the time source via the network, a correction factor for the precision time signal; and
    the at least one processing device is further configured to adjust the precision time signal based at least in part on the received correction factor.

18. The utility meter of claim 17, wherein:
    the network interface is further configured to receive, from the time source via the network, a network ping; and
    the at least one processing device is further configured to direct the communication, to the time source via the network, of a response to the network ping that includes a value of the precision time signal,
    wherein the response is utilized by the time source to calculate the correction factor.

19. The utility meter of claim 11, wherein the at least one controller is further configured to direct the communication of information associated with the phase determination.

20. The utility meter of claim 19, wherein the information is communicated to a data processing system.

* * * * *